US010224284B1

(12) United States Patent
Witt

(10) Patent No.: US 10,224,284 B1
(45) Date of Patent: Mar. 5, 2019

(54) SOLUBLE SELF ALIGNED BARRIER LAYER FOR INTERCONNECT STRUCTURE

(71) Applicant: GLOBALFOUNDRIES INC., Grand Cayman (KY)

(72) Inventor: Christian A. Witt, Woodbridge, CT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/863,113

(22) Filed: Jan. 5, 2018

(51) Int. Cl.
*H01L 23/532* (2006.01)
*H01L 21/768* (2006.01)

(52) U.S. Cl.
CPC .. *H01L 23/53238* (2013.01); *H01L 21/76841* (2013.01); *H01L 21/76847* (2013.01); *H01L 21/76877* (2013.01); *H01L 23/53233* (2013.01)

(58) Field of Classification Search
CPC ......... H01L 23/53238; H01L 21/76841; H01L 23/53233; H01L 21/76847; H01L 21/76877
See application file for complete search history.

(56) References Cited

U.S. PATENT DOCUMENTS

| 9,362,228 B2 | 6/2016 | Chae et al. | |
| 9,449,874 B1 | 9/2016 | Standaert et al. | |
| 2011/0017499 A1* | 1/2011 | Yang | H01L 21/76846 174/257 |
| 2011/0147940 A1 | 6/2011 | Akolkar | |
| 2014/0353835 A1 | 12/2014 | Chae et al. | |
| 2015/0228585 A1 | 8/2015 | He et al. | |
| 2016/0133513 A1* | 5/2016 | Hegde | H01L 23/53238 438/618 |
| 2017/0256498 A1* | 9/2017 | Standaert | H01L 21/76877 |

OTHER PUBLICATIONS

He et al., "Metal-Dielectric Interfaces in Gigascale Electronics", Springer Series in Materials Science 157, Springer Science+Business Media, LLC, 2012, 18 pages.
Koike et al., "Self-forming diffusion barrier layer in Cu—Mn alloy metallization", Applied Physics Letters 87, Jul. 22, 2005, 4 pages.
Nogami et al., "Through-Cobalt Self Forming Barrier (tCoSFB) for Cu/ULK BEOL: A Novel Concept for Advanced Technology Nodes", IEEE, 2015, 4 pages.
Park et al., "Effects of UV curing on the self-forming barrier process of Cu—V alloy films", Surface & Coatings Technology, 2015, No. 276, Abstract.

* cited by examiner

Primary Examiner — Selim U Ahmed
Assistant Examiner — Evan G Clinton
(74) Attorney, Agent, or Firm — Anthony Canale; Andrew M. Calderon; Roberts Mlotkowski Safran Cole & Calderon P.C.

(57) ABSTRACT

The present disclosure relates to semiconductor structures and, more particularly, to a soluble self-aligned barrier first for interconnect structure and methods of manufacture. The structure includes: a self-aligning barrier layer lining a trench of an interconnect structure; and an alloy interconnect material over the self-aligned barrier layer. The alloy interconnect material is an alloy composed of metal interconnect material and pre-anneal material that also forms the self-aligning barrier layer.

17 Claims, 3 Drawing Sheets

US 10,224,284 B1

SOLUBLE SELF ALIGNED BARRIER LAYER FOR INTERCONNECT STRUCTURE

FIELD OF THE INVENTION

The present disclosure relates to semiconductor structures and, more particularly, to a soluble self-aligned barrier layer for an interconnect structure and methods of manufacture.

BACKGROUND

Generally, the use of copper for interconnect structures requires the lining of trenches and vias with a copper diffusion and protection barrier such as TaN. At smaller technology nodes, this liner occupies a significant portion of the available cross section of the vias and/or trenches. As the liner material is typically of higher resistance, the overall resistivity of the interconnect structure also thus increases. This higher resistivity will affect device performance negatively and, hence, it is desirable to minimize the thickness of that layer while maintaining the barrier and lining functionality.

It is becoming more and more challenging to incorporate barrier liners into future interconnect structures. Typically in the Cu dual damascene interconnect structure, metal barriers are deposited into the trench and/or via, followed by deposition of a Cu seed layer. The Cu seed is used as a conductive layer for electrochemical plating (ECP) deposition of Cu. Because the trench and via sizes continue to shrink, both barrier and seed layers must be only several nanometers thick. However, it is difficult to control the uniformity, conformality, and integrity of such thin metal barrier deposition, even with advanced techniques such as atomic layer deposition (ALD). Moreover, after barrier deposition, the opening of the trench becomes even smaller, further limiting the seed layer and the ECP-Cu deposition.

SUMMARY

In an aspect of the disclosure, a structure comprises: a self-aligning barrier layer lining a trench of an interconnect structure; and an alloy interconnect material over the self-aligned barrier layer. The alloy interconnect material is an alloy composed of metal interconnect material and pre-anneal material that also forms the self-aligning barrier layer.

In an aspect of the disclosure, a structure comprises: a trench in an insulator material; a self-aligned barrier layer lining the trench; an alloy interconnect material composed of a dissolvable reaction material and a copper material, the alloy interconnect material being directly on a surface of the self-aligned barrier layer within the trench; and a dielectric capping material on a surface of the insulator material and the alloy interconnect material.

In an aspect of the disclosure, a method comprises: forming a dissolvable reaction material along sidewalls and bottom surfaces of a trench; annealing a portion of the dissolvable reaction material to a self-forming barrier layer; and filling interconnect material in the trench over un-converted portions of the dissolvable reaction material to form an alloy interconnect.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to a soluble self-aligned barrier layer for an interconnect structure and methods of manufacture. More specifically, the present disclosure provides a self-aligned barrier layer which reduces the overall resistivity of the contact structures, e.g., interconnect structures, in advanced nodes (compared to conventional interconnect structures). Advantageously, the self-aligned barrier layer will also prevent copper diffusion to other features within the semiconductor structure.

In embodiments, a self-forming barrier layer is formed by depositing an initial layer of dissolvable reaction material within a trench and/or via and converting (annealing) a portion of the dissolvable reaction material into a barrier layer. The initial layer is a material that does not include Cu, and is preferably Zn (although other dissolvable reaction materials can be used as described herein). The remaining un-converted initial layer will react with the interconnect metal, e.g., copper, deposited within the via and/or trench to form a Cu alloy interconnect structure. The final Cu alloy interconnect structure will have a lower resistivity compared to conventional interconnect structures of the same technology node. In addition, the self-forming barrier layer can be effectively used in smaller technology nodes, which are becoming too small (e.g., critical dimensions are becoming too small) to deposit both a barrier layer and the interconnect metal.

The interconnect structures of the present disclosure can be manufactured in a number of ways using a number of different tools. In general, though, the methodologies and tools are used to form structures with dimensions in the micrometer and nanometer scale. The methodologies, i.e., technologies, employed to manufacture the interconnect structures of the present disclosure have been adopted from integrated circuit (IC) technology. For example, the interconnect structures are built on wafers and are realized in films of material patterned by photolithographic processes on the top of a wafer. In particular, the fabrication of the interconnect structures uses three basic building blocks: (i) deposition of thin films of material on a substrate, (ii) applying a patterned mask on top of the films by photolithographic imaging, and (iii) etching the films selectively to the mask.

Figure 1:
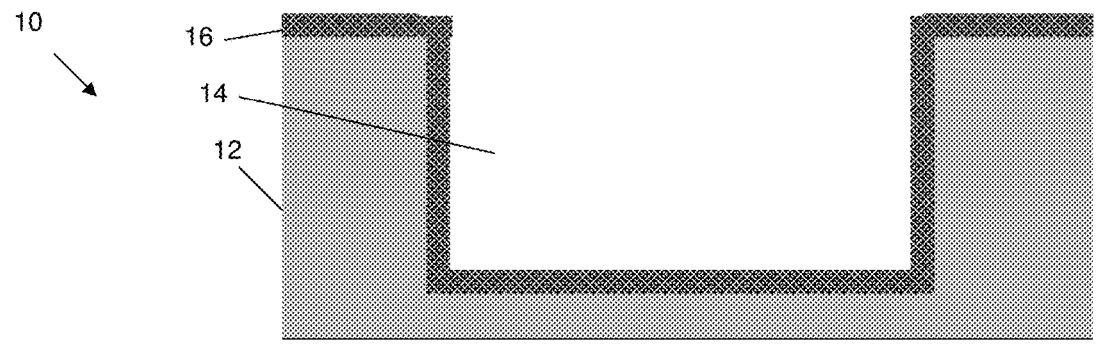
FIG. 1 shows a starting structure with a dissolvable reaction material in a trench structure and respective fabrication processes in accordance with aspects of the present disclosure.

FIG. 1 shows a structure and respective fabrication processes in accordance with aspects of the present disclosure. In particular, the structure 10 includes insulator material 12 having a via or trench 14 (hereinafter referred to as a trench). In embodiments, the insulator material 12 can be any appropriate dielectric material used for semiconductor fabrication processes. For example, the insulator material 12 can be an silicon oxide or ultra low-k material.

The trench 14 is formed in the insulator material 12 using conventional CMOS processes. For example, a resist formed over the insulator material 12 is exposed to energy (light) to form a pattern (opening). An etching process with a selective chemistry, e.g., reactive ion etching (RIE), will be used to form one or more trenches in the insulator material 12 through the openings of the resist. The resist can then be removed by a conventional oxygen ashing process or other known stripants.

Following the resist removal, a dissolvable reaction material 16 is deposited within the trench 14 by a conventional deposition process, e.g., physical vapor deposition (PVD), plasma enhanced chemical vapor deposition (PECVD) or atomic layer deposition (ALD) processes, amongst others. In embodiments, the dissolvable reaction material 16 is dissolvable with, e.g., copper, and is deposited to a sufficient thickness that guarantees sufficient reaction layer thickness as described herein. Any excess, unreacted material remaining at its surface is expected. This concept can be used by extension with other conductor materials, such as Cobalt, Ruthenium, etc.

In embodiments, the dissolvable reaction material 16 can be deposited to a thickness of about 2 nm to about 3 nm for a 7 nm and beyond technology node; although other thicknesses are contemplated depending on the technology node. For example, the dissolvable reaction material 16 can be scaled to ultrathin dimensions <1 nm. In further embodiments, a thickness of the dissolvable reaction material 16 can have a ratio to the critical dimension of the trench 14 of about 1:4. In addition, the amount of dissolvable reaction material, e.g., Zn, deposited should be sufficient to ensure a dense, continuous self-aligned barrier layer. The advantage from this disclosure is that the amount deposited can be increased as the excess material is being dissolved into the main conductor body and overburden, i.e., copper.

In embodiments, the dissolvable reaction material 16 is Zn; although other dissolvable reaction materials are contemplated herein depending on the needs to be accomplished. These other dissolvable reaction materials can be, e.g., Mn, Ni, Ti, Mg, Al, Ag, Ca, Be, Cd, Au, Be, Pd, Hg, In, B, Ga, Pt, Si, Sn, Pb, Ge, Cr, Co, and other alloying elements. By way of non-limiting illustrative example, Zn is readily soluable <400° C. in Cu. Moreover, Zn exhibits one of the lowest resistivity-coefficients to copper resistivity, amongst the other dissolvable reaction materials. Zn doping may also be effective in reducing hillocking during high temperature anneal which is a very useful feature to achieve high temperature post plating annealing conditions. It is further noted that Zn is a preferred dissolvable reaction material as it exhibits ample opportunity to form a protective oxide/oxynitride barrier layer, depending on the surface condition of the dielectric material, e.g., insulator material 12. Moreover, additional heat during or after deposition may be added to aid the oxide/oxynitride formation.

Figure 2:
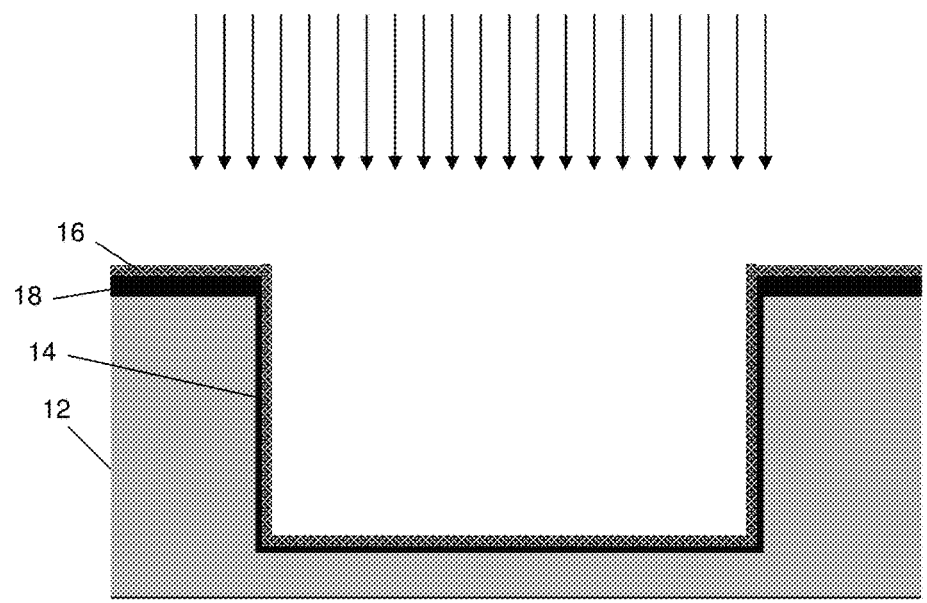
FIG. 2 shows a barrier layer and the dissolvable reaction material in the trench structure and respective fabrication processes in accordance with aspects of the present disclosure.

As shown in FIG. 2, the dissolvable reaction material 16 undergoes an annealing process to form an underlying dense, continuous self-aligned barrier layer 18. In embodiments, the dense, continuous self-aligned barrier layer 18 is an oxynitride or $ZnO_2$ as an example. It is noted that the dense, continuous self-aligned barrier layer 18 will be of sufficient thickness to prevent copper diffusion, while still guaranteeing sufficient reaction layer thickness with the interconnect material (copper). That is, the annealing process will ensure portions of the dissolvable reaction material 16 will remain to dissolve with the Cu or other metal interconnect material. That is, any excess Zn material (or other dissolvable material 16) is dissolved after metal fill within the Cu matrix.

In embodiments, the annealing process can be provided at about 400° C. or lower, and preferably at about 250° C. for about 1 to 3 minutes. In further embodiments, the annealing can take place at a temperature of about 300° C. to about 350° C. In further embodiments, prior to annealing, the dissolvable reaction material 16 (e.g., Zn) can undergo a plasma treatment to enrich the dissolvable reaction material 16 with oxygen or nitrogen. It should also be noted a challenge of when the barrier forming element is dilutely alloyed with the as-deposited Cu, the self-forming barrier layer formation competes with Cu out-diffusion and surface reaction, making it difficult to form a dense, continuous and Cu-free barrier layer. However, by implementing the processes and materials herein, this problem is solved.

Figure 3:
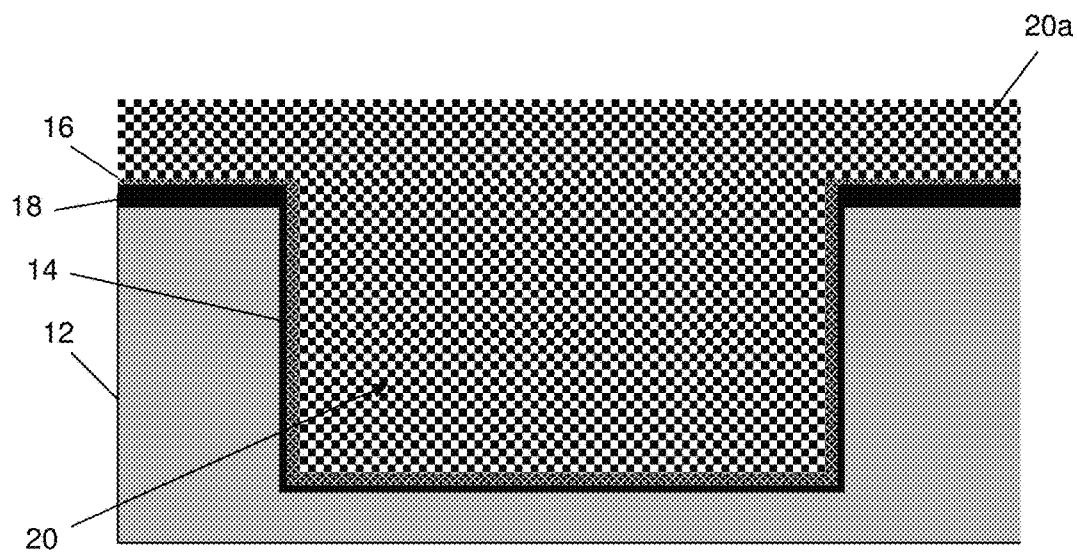
FIG. 3 shows an interconnect material on the dissolvable reaction material in the trench structure and respective fabrication processes in accordance with aspects of the present disclosure.

In FIG. 3, a metal interconnect material 20, e.g., Cu, is deposited in the trench 14 and, more specifically, over the dissolvable reaction material 16. In embodiments, the metal interconnect material 20 can be deposited by any conventional deposition process, e.g., depositing a Cu seed followed by electrochemical fill, plating. As shown in FIG. 3, the metal interconnect material 20 is deposited above the surface of the trench 14, effectively providing an overburden of metal interconnect material 20, as depicted by reference numeral 20a. This additional overburden 20a is useful to dilute the dissolvable reaction material 16 into the metal interconnect material 20 during the subsequent alloying process.

Figure 4:
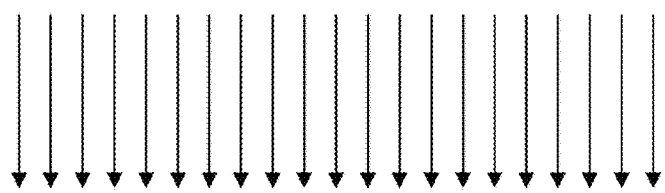
FIG. 4 shows an alloy interconnect material in the trench structure and respective fabrication processes in accordance with aspects of the present disclosure.
Figure 4:
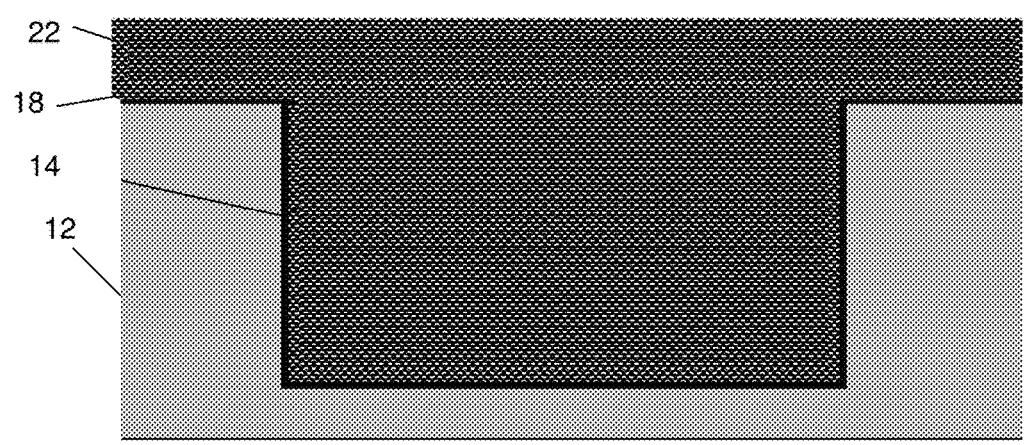

In FIG. 4, the metal interconnect material 20 and the dissolvable reaction material 16 undergo an annealing process which dissolves the reaction material 16 into the metal interconnect material 20 thereby forming a copper alloy 22. More specifically, the excess material of the dissolvable reaction material 16 is given the opportunity to dissolve in the Cu matrix, homogenizing the mixture resulting in the alloy 22. In embodiments, the annealing can take place at below 400° C.

The final concentration of the alloy 22 is controlled by the ratio of excess dissolvable reaction material 16, e.g., Zn, and the amount of Cu overburden 20a, and anneal time and temperature. For example, the final concentration of the dissolvable reaction material in the metal interconnect material can be in the range of about 1% to 2% and, more preferably about 0.5% to about 1.0% and even more preferably about 0.05% to 0.5%. In further embodiments, the final concentration of the dissolvable reaction material in the metal interconnect material can be in the range of about 0.05% to 2%, as one example when using Zn. In some cases, concentrations may be chosen higher up to, e.g., 20-30%.

It is noted that when using Zn, the alloy 22 will have only a slightly higher bulk resistivity than, e.g., Cu, as the impurity effect of Zn is one of the lowest of all binary Cu alloys. However, it should be recognized by those of skill in the art that the final electrical resistivity of the alloy 22 will be determined by the chosen alloying element and concentration thereof in the metal interconnect material 20. Also, importantly, the effect of bulk resistivity is becoming less important at deeply scaled dimensions, where surface scattering becomes dominant. It is also contemplated to pre-treat the dielectric surface, for example, a pre-nitridation may be added to shift the final barrier stoichiometry towards N, if so desired. Other pre-treatments such as organic grafting are possible to achieve a higher content of Metal-carbide, i.e., Zn-carbide if so desired. Importantly, also, is that the processes described herein are compatible with standard BEOL processing, e.g., within the temperature budget.

Figure 5:
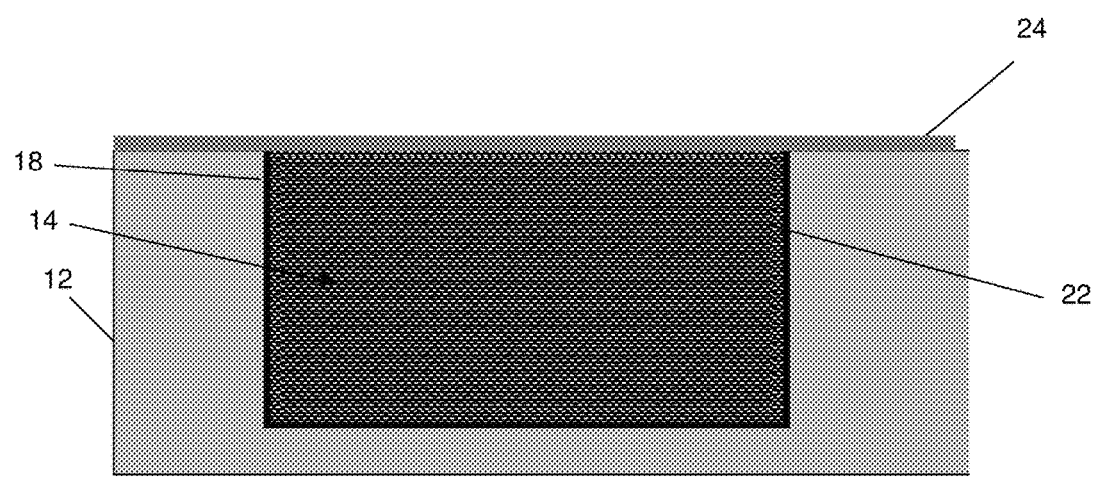
FIG. 5 shows a capping layer on the alloy interconnect material in the trench structure and respective fabrication processes in accordance with aspects of the present disclosure.

FIG. 5 shows a capping layer 24 over the alloy (alloy interconnect material) 22 in the trench structure 14. In FIG. 5, any overburden of the alloy interconnect material 22 is removed by a conventional planarization process, e.g., chemical mechanical polishing (CMP). The CMP process will also remove any barrier material (e.g., barrier layer 18) from the surface of the insulator material 12. The capping layer 24 is then deposited on the insulator material 12 and over the alloy interconnect material 22 using conventional deposition processes, e.g., CVD. The capping layer is often comprised of SiCN.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
a self-aligning barrier layer lining a trench of an interconnect structure; and
an alloy interconnect material over the self-aligned barrier layer, the alloy interconnect material being an alloy composed of metal interconnect material and pre-anneal material that also forms the self-aligning barrier layer,
wherein the self-aligning barrier layer is oxynitride or $ZnO_2$.

2. The structure of claim 1, wherein the pre-anneal material is a dissolvable reaction material.

3. The structure of claim 2, wherein the pre-anneal material is Zn.

4. The structure of claim 2, wherein the dissolvable reaction material is one of Zn, Mn, Ni, Ti, Mg, Al, Ag, Ca, Be, Cd, Au, Be, Pd, Hg, In, B, Ga, Pt, Si, Sn, Pb, Ge, Cr, and Co.

5. The structure of claim 2, wherein the alloy interconnect material has a concentration of the dissolvable reaction material of about 2% to 20%.

6. The structure of claim 2, wherein the alloy interconnect material has a concentration of the dissolvable reaction material of about 1% to 2%.

7. The structure of claim 2, wherein the alloy interconnect material has a concentration of the dissolvable reaction material of about 0.5% to about 1.0%.

8. The structure of claim 2, wherein the alloy interconnect material has a concentration of the dissolvable reaction material of about 0.05% to 0.5%.

9. The structure of claim 1, wherein the metal interconnect material is Cu and the alloy interconnect material is CuZn.

10. A structure comprising:
a trench in an insulator material;
a self-aligned barrier layer lining the trench;
an alloy interconnect material composed of a dissolvable reaction material and a copper material, the alloy interconnect material being directly on a surface of the self-aligned barrier layer within the trench; and
a dielectric capping material on a surface of the insulator material and the alloy interconnect material,
wherein the self-aligning barrier layer is oxynitride or $ZnO_2$.

11. The structure of claim 10, wherein the dissolvable reaction material is Zn.

12. The structure of claim 11, wherein the alloy interconnect material has a concentration of the dissolvable reaction material in a range of 0.05% to 2%.

13. The structure of claim 11, wherein the metal interconnect material is Cu.

14. The structure of claim 11, wherein the alloy interconnect material is CuZn.

15. The structure of claim 10, wherein the dissolvable reaction material is one of Zn, Mn, Ni, Ti, Mg, Al, Ag, Ca, Be, Cd, Au, Be, Pd, Hg, In, B, Ga, Pt, Si, Sn, Pb, Ge, Cr, and Co.

16. A method, comprising:
forming a dissolvable reaction material along sidewalls and bottom surfaces of a trench;
annealing a portion of the dissolvable reaction material to form a self-forming barrier layer composed of oxynitride or $ZnO_2$; and,
filling interconnect material in the trench over un-converted portions of the dissolvable reaction material to form an alloy interconnect.

17. The method of claim 16, wherein the alloy interconnect comprises Cu and an element selected from the group consisting of Zn, Mn, Ni, Ti, Mg, Al, Ag, Ca, Be, Cd, Au, Be, Pd, Hg, In, B, Ga, Pt, Si, Sn, Pb, Ge, Cr, and Co.

* * * * *